United States Patent [19]

Wojnarowski et al.

[11] Patent Number: 5,200,810

[45] Date of Patent: Apr. 6, 1993

[54] HIGH DENSITY INTERCONNECT STRUCTURE WITH TOP MOUNTED COMPONENTS

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 504,749

[22] Filed: Apr. 5, 1990

[51] Int. Cl.$^5$ ............... H01L 23/02; H01L 23/16; H05K 1/00; H05K 7/02

[52] U.S. Cl. .................. 361/398; 361/397; 361/400; 257/668

[58] Field of Search ......... 357/74, 82, 71, 80, 357/75; 361/397, 398, 400

[56] References Cited

U.S. PATENT DOCUMENTS

| | | | |
|---|---|---|---|
| 3,683,105 | 8/1972 | Shamash et al. | 357/75 |
| 4,714,516 | 12/1987 | Eichelberger et al. | 156/628 |
| 4,774,630 | 9/1988 | Reisman et al. | 357/82 |
| 4,780,177 | 10/1988 | Wojnarowski et al. | 156/643 |
| 4,783,695 | 11/1988 | Eichelberger et al. | 357/65 |
| 4,809,058 | 2/1989 | Funamoto et al. | 357/74 |
| 4,835,704 | 5/1989 | Eichelberger et al. | 364/490 |
| 4,878,991 | 11/1989 | Eichelberger et al. | 156/630 |
| 4,882,200 | 11/1989 | Liu et al. | 427/53.1 |
| 4,884,122 | 11/1989 | Eichelberger et al. | 357/71 |
| 4,894,115 | 1/1990 | Eichelberger et al. | 156/643 |
| 4,897,153 | 1/1990 | Cole et al. | 156/643 |
| 4,914,259 | 4/1990 | Kobayashi et al. | 361/397 |
| 4,922,325 | 5/1990 | Smeltz et al. | 357/74 |
| 4,930,002 | 5/1990 | Takenaka et al. | 357/74 |
| 4,933,042 | 6/1990 | Eichelberger et al. | 156/239 |
| 4,960,613 | 10/1990 | Cole et al. | 427/53.1 |
| 4,988,412 | 1/1991 | Liu et al. | 204/15 |
| 5,019,946 | 5/1992 | Eichelberger et al. | 361/414 |
| 5,027,255 | 6/1991 | Zeitlin et al. | 361/398 |
| 5,028,473 | 7/1991 | Vitriol et al. | 361/397 |

Primary Examiner—Andrew J. James
Assistant Examiner—Carl Whitehead, Jr.
Attorney, Agent, or Firm—Marvin Snyder

[57] ABSTRACT

The functionality, versatility and connection and packing density of a high density interconnect structure is enhanced by mounting one or more components on top of the high density interconnect structure for connection to conductors of the high density interconnect structure and the chips embedded within the high density interconnect structure. Both active and passive components may be mounted in this manner, as may components which would be adversely affected by high density interconnect structure fabrication temperatures or by the presence of the high density interconnect structure dielectric.

36 Claims, 7 Drawing Sheets

HIGH DENSITY INTERCONNECT STRUCTURE WITH TOP MOUNTED COMPONENTS

RELATED APPLICATIONS

The present application is related to application Ser. No. 07/504,769, filed Apr. 5, 1990, concurrently herewith, entitled "Flexible High Density Interconnect Structure and Flexibly Interconnected System" by C. W. Eichelberger et al. and application Ser. No. 07/504,751, filed Apr. 5, 1990, concurrently herewith, entitled "Compact, Thermally Efficient Focal Plane Array and Testing and Repair Thereof", by W. P. Kornrumpf et al., each of which is incorporated herein by reference in its entirety.

BACKGROUND OF THE INVENTION

The present invention relates to the field of high density interconnected circuits, and more particularly to increasing the versatility, effective density and efficiency of such systems.

BACKGROUND INFORMATION

A high density interconnect (HDI) structure or system which has been developed by General Electric Company offers many advantages in the compact assembly of electronic systems. For example, an electronic system such as a micro computer which incorporates 30-50 chips can be fully assembled and interconnected on a single substrate which is 2 inch long by 2 inch wide, by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 25-100 mils thick and of appropriate size and strength for the overall system, is provided. This size is typically less than 2 inches square. Once the position of the various chips has been specified, individual cavities or one large cavity having appropriate depth at the intended locations of differing chips, is prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. Thereafter, a polyimide film which may be Kapton ® polyimide, available from E.I. du Pont de Nemours Company, which is $\approx 0.0005$–$0.003$ inch ($\approx 12.5$–$75$ microns) thick is pretreated to promote adhesion and coated on one side with the ULTEM ® polyetherimide resin or another thermoplastic and laminated across the top of the chips, any other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the Patents and Applications which are listed hereinafter.

In this manner, the entire interconnect structure can be fabricated from start to finish (after definition of the required conductor patterns and receipt of the electronic components) in as little as $\approx 8$–$12$ hours.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. Patent application Ser. No. 249,927, filed Sep. 27, 1989, entitled "Method and Apparatus for Removing Components Bonded to a Substrate" by R. J. Wojnarowski, et al.; U.S. Pat. No. 4,894,115, issued Jan. 16, 1990 entitled "Laser Beam Scanning Method for Forming Via Holes in Polymer Materials" by C. W. Eichelberger, et al.; U.S. Patent application Ser. No. 312,798, filed Feb. 21, 1989, entitled "High Density Interconnect Thermoplastic Die Attach Material and Solvent Die Attachment Processing" by R. J. Wojnarowski, et al.; U.S. Pat. No. 4,878,991, issued Nov. 7, 1989 entitled "Simplified Method for Repair of High Density Interconnect Circuits" by C. W. Eichelberger, et al.; U.S. Patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al. now U.S. Pat. No. 5,019,946, issued May 28, 1991; U.S. patent application Ser. No. 329,478, filed Mar. 28, 1989, entitled "Die Attachment Method for Use in High Density Interconnected Assemblies" by R. J. Wojnarowski, et al.; U.S. Pat. No. 4,960,613, issued Oct. 2, 19, entitled "Laser Interconnect Process" by H. S. Cole, et al.; U.S. Pat. No. 4,884,122, issued Nov. 28, 19, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S.. Liu, et al.; U.S. Pat. No. 4,882,220, issued Nov. 21, 1989, entitled "Method for Photopatterning Metallization Via UV Laser Ablation of the Activator" by Y. S.. Liu, et al.; U.S. patent application Ser. No. 237,685, filed Aug. 25, 1988, entitled "Direct Writing of Refractory Metal Lines for Use in Integrated Circuit Devices" by Y. S.. Liu, et al.; U.S. Pat. No. 4,933,042 issued Jun. 12, 1990, entitled "Method and Apparatus for Packaging Integrated Circuit Chips Employing a Polymer Film Overlay Layer" by C. W. Eichelberger, et al.; U.S. Pat. No. 4,897,153, issued Jan. 30, 1990, entitled "Method of Processing Siloxane-Polyimides for Electronic Packaging Applications" by H. S. Cole, et al.; U.S. Pat. No. 4,988,412, issued Jan. 29, 1991, entitled "Selective Electrolytic Deposition on Conductive and Non-Conductive Substrates" by Y. S.. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski, now abandoned; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al. Each of these Patents and Patent Applications is incorporated herein by reference.

Ceramic chip capacitors are incorporated within the high density interconnect structure when bypass capacitors are required to hold the supply line voltages at desired levels during occurrences of high power drain because of the inherent operation of the high density interconnected components or because of exposure of the system to external influences which cause substantial current to be drawn for a brief period. These bypass capacitors are also known as rail hold up capacitors. These ceramic capacitors are typically thicker than semiconductor chips. In order to maintain a planar surface for the fabrication of the high density interconnect structure the portions of the chip-holding cavity where the capacitors will be placed must be milled deeper than the portions where semiconductor chips will be disposed. The ceramic chip capacitors are then placed in these deeper wells and the semiconductor chips are placed in the shallower wells, all prior to lamination of the high density interconnect structure dielectric layer thereover. The end contacts on ceramic chip capacitors are normally formed by dipping the ceramic dielectric material in a metal deposition bath. That bath may be a plating solution or molten metal, as may be desired. This end contact formation technique normally results in a dog bone capacitor configuration in which the end contacts are taller than the ceramic dielectric material disposed therebetween. Further, unlike semiconductor chips which are diced from wafers which are sawn from boules with tight tolerances on wafer thickness, the physical dimensions of such capacitors are not tightly controlled with the result that any given capacitor may be significantly thicker or thinner than its specified nominal thickness. Such capacitors which are taller or shorter than the nominal value produce peaks or mesas and depressions or valleys, respectively, in the initial HDI dielectric layer which is laminated over the substrate and the chips disposed in its cavity or cavities. Such peaks and valleys make the formation of the high density interconnecting conductors difficult or impossible. In addition, too tall capacitors sometimes crack during the lamination process because the forces which are applied to their end contacts put excessive stress on their ceramic dielectric. When the high density interconnect structure must be removed in order to replace a faulty component or to change the wiring within the high density interconnect structure itself, the removal and clean up procedures for removing the high density interconnect metal from the semiconductor chip contact pads attack and destroy the end contacts of these capacitors which employ a different metallization than the semiconductor chips. As a result, all of these capacitors must be replaced each time the high density interconnect structure is peeled off and replaced. There is a need for an improved capacitor mounting technique which avoids the problems of breakage, mesa and valley formation and destruction of the capacitor electrodes during system repair.

Fault tolerant systems incorporate redundant, spare components, usually in the form of extra semiconductor chips or chips with multiple, separately connectable subsystems. At present, when testing discloses that one of the connected chips or subsystems is faulty, the high density interconnect structure is peeled off and a new high density interconnect structure which does not connect that faulty chip or substrate is fabricated on the system. There is a need for a simple, effective means of selecting among the available chips without the necessity of removing the high density interconnect structure and providing a different metallization pattern therein. In some prior art non-high density interconnect systems electrically programmable read only memories (EPROMS) provide this function. However, such techniques are not applicable to the high density interconnect structure as disclosed in the above-identified background patents and applications because most such EPROMS are erased by exposing them to ultraviolet, whereas the dielectric layers of the high density interconnect structure absorb ultraviolet light and thus prevent erasure of EPROMS which are embedded in the high density interconnect structure.

Related application Ser. No. 07/504,821, filed Apr. 5, 1990 entitled "High Density Interconnect Microwave Circuit Assembly" by W. P. Kornrumpf et al. provides a potential solution to this problem by selectively removing the high density interconnect structure dielectric over components which are sensitive to the presence of that dielectric. However, such a procedure is not ideal for all components.

Further, there are components which it is desirable to include in a high density interconnect structure which are adversely affected by the temperatures used in the fabrication of the high density interconnect structure. The technique of subsequently removing the dielectric layer of that high density interconnect structure does nothing to solve the problem of exposure of components to the high density interconnect structure's fabrication temperatures.

A further problem in systems containing spare components which are interconnected using the high density interconnect structure of the background patents and applications is the fact that a fairly extensive surface area is required in the high density interconnect structure to contain those chips. Any control chip for selectively choosing among the components and spares must generally be positioned in a manner which either results in relatively long conductor runs between it and some of the components whose connection it controls or else that chip must be positioned where it results in an increase in the length of the conductor runs among the chips it controls.

Consequently, there is need for a further increases in system density, efficiency and symmetricalness of interconnecting structures within a high density interconnect structure in accordance with the background patents and applications.

OBJECTS OF THE INVENTION

Accordingly, a primary object of the present invention is to provide a high density interconnect structure which serves to increase overall system density.

Another object of the present invention is to provide a high density interconnect structure which reduces the footprint of the complete high density interconnected system.

Another object of the present invention is to provide a high density interconnect structure which is compatible with temperature sensitive components.

Another object of the present invention is to provide a high density interconnect structure which minimizes the length of conductor runs between control chips and primary and spare components without adversely affecting the placement density of those primary and spare components.

Another object of the present invention is to provide a high density interconnect structure incorporating components which are sensitive to signals within a portion of the spectrum which are attenuated by the dielectric materials of the high density interconnect structure without a need to remove dielectric material from such sensitive components.

Another object of the present invention is to repair high density interconnected structures without removing the high density interconnect structure.

Still another object of the present invention is to provide a means for testing complex circuitry within a high density interconnect structure and for rendering selected portions therein active in accordance with the test results.

Still another object of the present invention is to provide an exterior means of programming a system within a high density interconnect structure.

Still another object of the present invention is to provide a means of trimming or tweaking the operating characteristics of a high density interconnect structure without disassembling that structure.

Yet another object of the present invention is to provide a fault tolerant high density interconnected system with external means for selecting among redundant components within the high density interconnect structure.

Yet another object of the present invention is to provide a means of increasing the packing density of a high density interconnect structure by placing odd size and low density components on the exterior surface of the high density interconnect structure.

Yet another object of the present invention is to enable an optical sensing array to be placed directly over separate control or scanning circuitry in a compact, high reliability manner.

A further object of the present invention is to place control chips within a high density interconnect structure and to place the subsystem they control on an exterior surface of the high density interconnect structure.

A further object of the present invention is to provide a means of operating a high density interconnect structure as a smart substrate for a component mounted on the exterior surface thereof.

A still further object of the present invention is to provide a means of applying engineering changes to a high density interconnect structure after its fabrication without disassembling it.

A still further object of the present invention is to provide a means of reconfiguring a system within a high density interconnect structure without disassembling that structure.

SUMMARY OF THE INVENTION

The above and other objects which will become apparent from the specification as a whole, including the drawings, are achieved in accordance with the present invention by, after completion of the high density interconnect (HDI) structure fabrication process, mounting auxiliary components or chips on top of the high density interconnect structure. The high density interconnect structure is designed with exposed contact pads for connection of those top-mounted chips and components.

In accordance with one embodiment of the invention, all rail hold-up capacitors are mounted on top of the high density interconnect structure rather than being placed in the cavity in the substrate in which the individual semiconductor chips are disposed. These capacitors are preferably attached only after the high density interconnect structure has successfully passed all electrical tests, thereby assuring that the high density interconnect structure will not need to be peeled from the substrate for repair purposes.

Top-mounted semiconductor chips may be mounted in a variety of ways. These include flip-chip mounting on contact pads which are exposed at the upper surface of the HDI structure, wire bonding, bonding to a flexible portion of the high density interconnect structure itself and any other appropriate techniques. Top-mounted components may include EPROMS, radiation sensitive devices, control chips and other active devices as may be appropriate as well as passive components such as capacitors and inductors.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
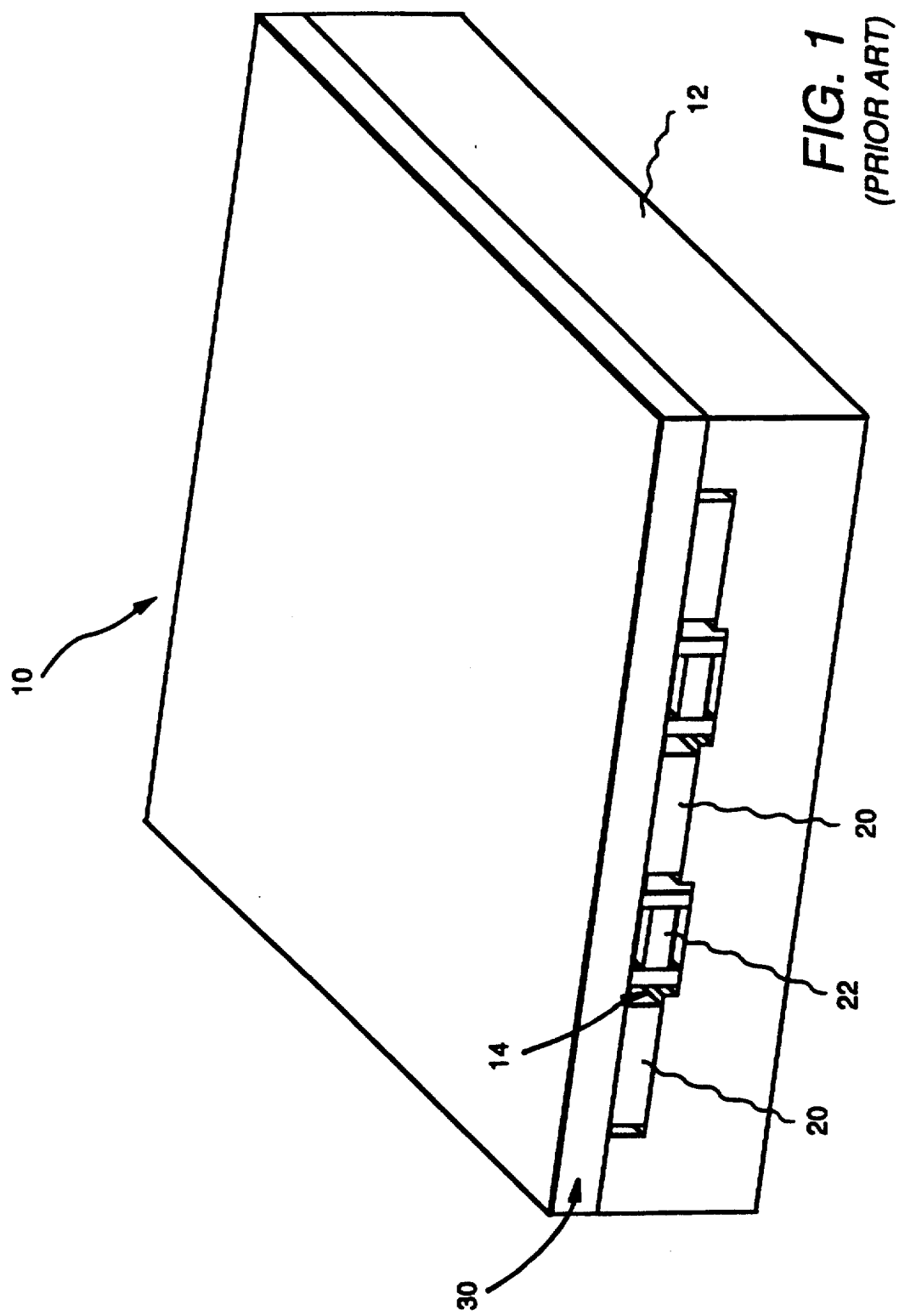
FIG. 1 illustrates a prior art high density interconnect structure.

In FIG. 1, a prior art high density interconnect structure in accordance with the background patents and applications is illustrated generally at 10. This high density interconnect structure comprises a substrate 12 having a plurality of integrated circuit chips 20 mounted in a cavity 14 in the upper surface thereof. In addition to the semiconductor chips 20, a plurality of discrete ceramic capacitors 22 are mounted in deeper portions of the cavity 14. A high density interconnect structure 30 is disposed over the upper surface of the substrate 12, the integrated circuit chips 20 and the capacitors 22. The high density interconnect structure comprises one or more dielectric layers along with one or more layers of patterned metal conductors which interconnect the various chips and capacitors by extending into via holes in the dielectric material in alignment with contact portions of the chips and capacitors. As has been discussed in the background information portion of the specification, this structure has the disadvantage of requiring that the cavity 14 have a varying depth in accordance with whether an integrated circuit chip or a capacitor is to be disposed in that portion of the cavity and also suffers from the disadvantage that the varying sizes of the capacitors can result in valleys or mesas in the overlying dielectric structure which can complicate or make impossible the fabrication of the high density interconnect structure in the desired manner.

The high density interconnect structure includes an initial dielectric layer which is disposed on the chips and substrate. A first layer of metal conductors is disposed on this layer of dielectric material. This structure can be the entire high density interconnect structure, in which case, those conductors are disposed on the layer of dielectric material. In other high density interconnect structures, a second layer of dielectric material is disposed over the first layer of conductors and the portions of the first layer of dielectric material which are exposed between the conductors of the first layer. In this type of structure, the conductors are embedded in or disposed in the dielectric material. For more complex systems a second layer of conductors is disposed on the second layer of dielectric material. Additional layers of dielectric material and conductors may be included in the high density interconnect structure as may be needed or desired. Consequently, the conductors of the high density interconnect structure may be disposed on the dielectric material, may be disposed in the dielectric material or may be disposed both in and on the dielectric material.

Figure 2:
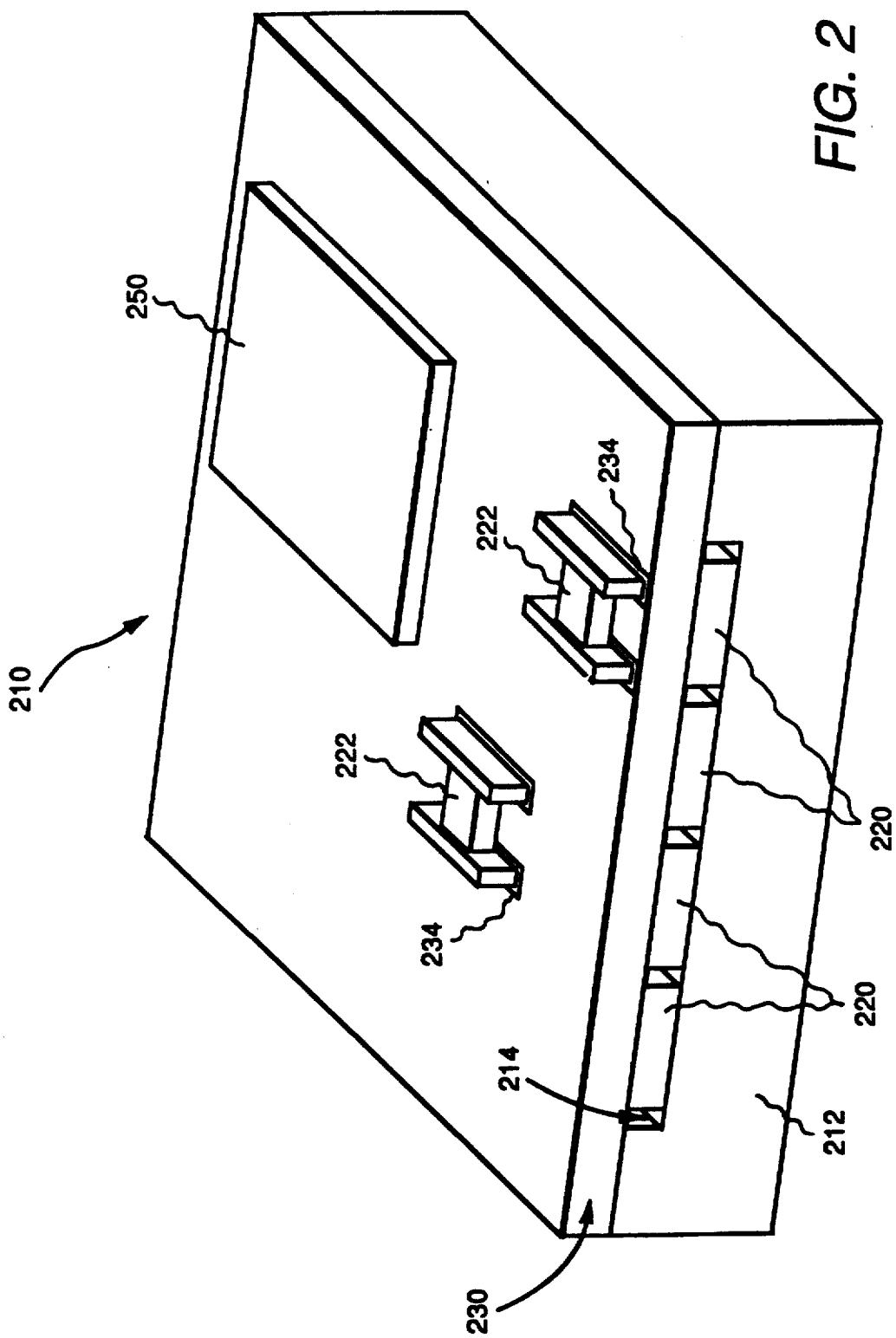
FIGS. 2-7 illustrate various high density interconnect structures in accordance with the present invention.
Figure 1A:
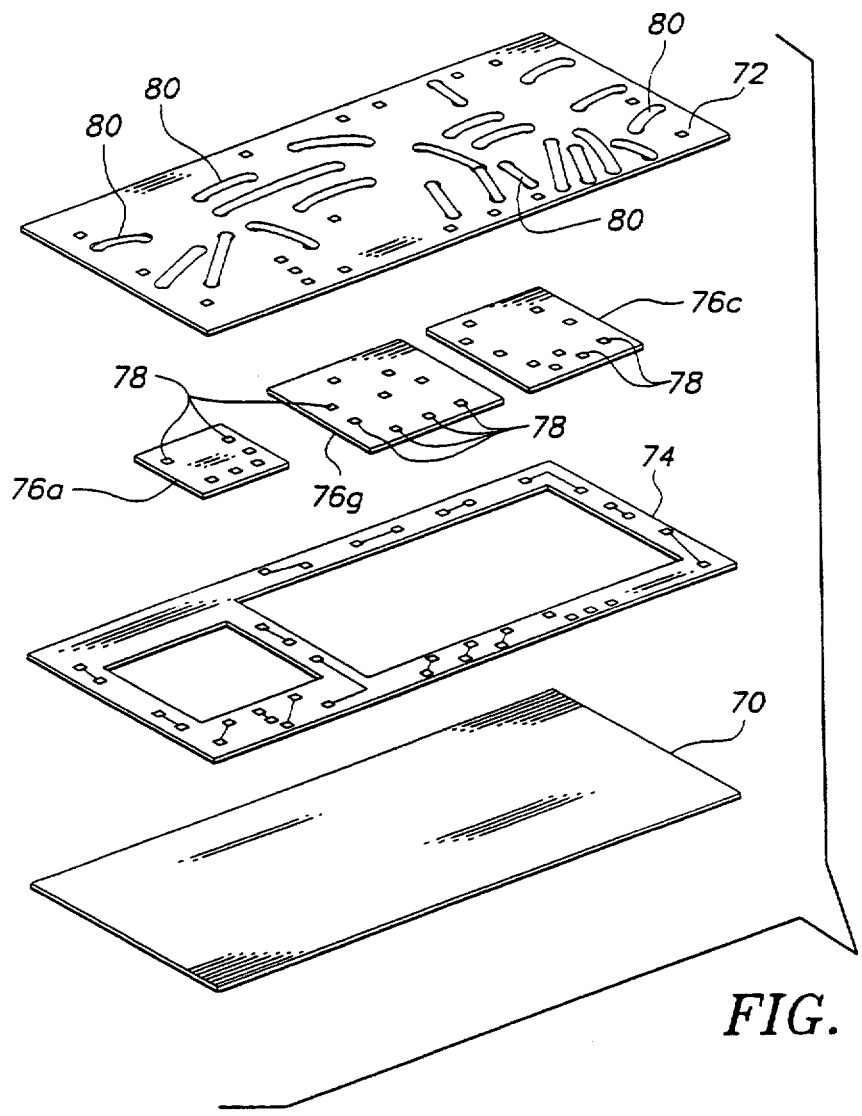
FIG. 1A is an exploded, isometric view of a prior art high density interconnect structure.
Figure 1B:
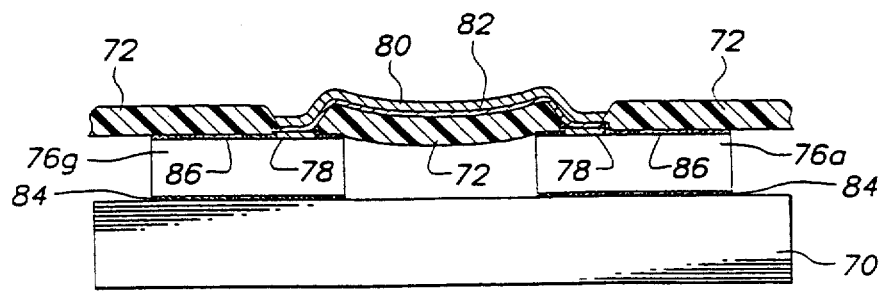
FIG. 1B is a cross-sectional side elevation view illustrating an interchip connection in a prior art high density inteconnect structure.

Further details of the prior art high density inteconnect structure are illustrated in FIGS. 1A and 1B, which correspond to FIGS. 1 and 2 of the above-incorporated Eichelberger et al U.S. Pat. No. 4,783,695, but with reference numerals changed.

In FIG. 1A, there are three distinct layers shown in exploded fashion: a substrate layer 70, a packaging layer and overlay layer 72. The packaging layer includes optional packing insert 74 having apertures into which chips 76a, 76b and 76c are placed. It is noted that the number and arrangement of integrated circuit chips shown in FIG. 1A is solely for the purpose of illustration. Likewise, the placement of interconnect pads 78 on the chips and the placement of interconnect metallization patterns 80 on layer 72 is likewise merely exemplary. There may be more chips or fewer chips configured in numerous arrangements and interconnected in numerous different fashions as determined by conductive patterns on overlay layer 72 and packaging insert 74 and most importantly by the desired function of the chip system. It is also noted that packaging insert 74 is preferred, but is optional.

FIG. 1B is a cross-section of a high density interconnection structure. As can be seen in the figure, there is a bridge comprising flexible polymer material 72 and a layer of thin metallization between two interconnected chips. Polymer layer 72 and metallization patterns 80 are also seen in a broader perspective view in FIG. 1A. The layer of metallization includes copper metallization 80, and also preferably includes optional titanium barrier layer 82. Adhesive material 84 serves to affix integrated circuit 76a and 76b to substrate 70. Similarly, adhesive 86 is preferably employed to affix polymer layer 72 to the substrate/chip structure. It is, however, noted that adhesive layer 86 is generally optional and is not necessarily included in every fabrication method.

A high density interconnect structure 210 in accordance with the present invention is illustrated in a perspective view in FIG. 2. The structure 210 comprises a substrate 212 having a plurality of semiconductor chips 220 disposed in a cavity 214 therein. Throughout this specification, reference numerals which end with the same two digits refer to similar structures. These structures may be the same or modified from one figure to another as is appropriate. Where unmodified elements or slightly modified elements are not specifically discussed in connection with a particular figure or embodiment, the reader is referred to an earlier discussion of that element for its purpose or function. Where a reference numeral is changed by adding a prime (') or a double prime ("), that identifies a similar structure which has been modified.

A high density interconnect structure 230 overlies the substrate 212 and the chips 220 and is bonded thereto and contains conductors (not shown) which interconnect the various chips into the desired system. A plurality of contact pads 234 are exposed at the upper surface of the high density interconnect structure 230. After completion of the high density interconnection structure and preferably after completion of electrical testing of that structure, discrete chip capacitors 222 (two being shown) are bonded to contact pads 234 on the upper surface of the high density interconnect structure. With this placement of the capacitors 222, the cavity 214 is made uniform in depth when all of the integrated circuits are the same thickness. In addition to the capacitors 222, a control chip 250 is disposed on the upper surface of the high density interconnect structure and is bonded thereto through use of a flip chip bonding technique such as solder reflow of a solder bumped chip 250. If the control chip 250 is required for proper testing of the structure, it is bonded to the system after preliminary electrical testing, but prior to doing the tests which require its presence.

The control chip 250 can perform any of a variety of functions depending on the characteristics of the overall system in which the high density interconnect structure is included. One such function is decoding where the chips embedded in the HDI structure comprise an array of cells or subsystems (such as a memory array) which need to be addressed individually or in selected groupings. Another such function is controlling which chips or subsystems within the HDI structure are active in the overall system where the HDI embedded chips include spare chips or subsystems which are connected by the high density interconnect structure in a manner which enables the control chip or chips to inactivate a faulty chip or subsystem and activate a spare chip or subsystem in its place. Other useful functions for the top mounted chip 250 can include image sensors such as CCD sensors, TV sensors, infrared image sensors and arrays, all of whose functions can be enhanced by having the substrate chips function as a smart substrate for that top mounted component by placing the control chips for the top mounted chip directly under it in a fashion which minimizes wiring length and maximizes the symmetric arrangement of chips. The top mounted component or components may also function as memory controllers where the chips within the high density interconnect structure comprise a memory array whereby the memory controller mounted on top enhances the operation of the system disposed within the high density interconnect structure. Similarly, the top mounted component may serve as a test controller for controlling the application of test signals to selected portions of a system embedded in the high density interconnect structure in a manner which isolates different portions of the embedded system for testing purposes. Following the completion of such testing, the test controller may either impose essentially permanent connections of functional system parts within the high density interconnect structure, or may be removed and replaced by hard wiring or control chips such as electronically programmable read only memories to control the connection of the functioning portions of the embedded system in an electronically reconfigurable manner which excludes inoperative portions of the embedded system from being active.

For example, in a system which requires eight identical, functional chips within the high density interconnect structure, nine chips may be mounted in the high density interconnect structure in a 3 by 3 array with their input and output pads brought to the upper surface of the high density interconnect structure where a top mounted chip is connected to all nine internal chips and selectively tests each of them and upon the completion of testing, if all are functional, selects eight of them for interconnection to the external portions of the system and in the event that one of them is faulty, excludes that one and connects the eight functional chips into the system.

It will be apparent that more complex selection and interconnection may be employed with more complex systems. Further, where such a system is sufficiently complex, a further layer of high density interconnect structure may be applied over the top mounted chips following the testing and configuration of the embedded structure and the top mounted chips. This may be accomplished by placing a planarizing template or stencil on top of the high density interconnect structure. The upper surface of this template should be substantially co-planar with the top mounted chips. A high density interconnect structure is applied thereover to permanently connect the system and the top mounted chips in a desired manner. The top mounted component may also comprise a thermoelectric cooler where it is desired to cool the high density interconnect structure from the upper surface thereof.

Figure 3:
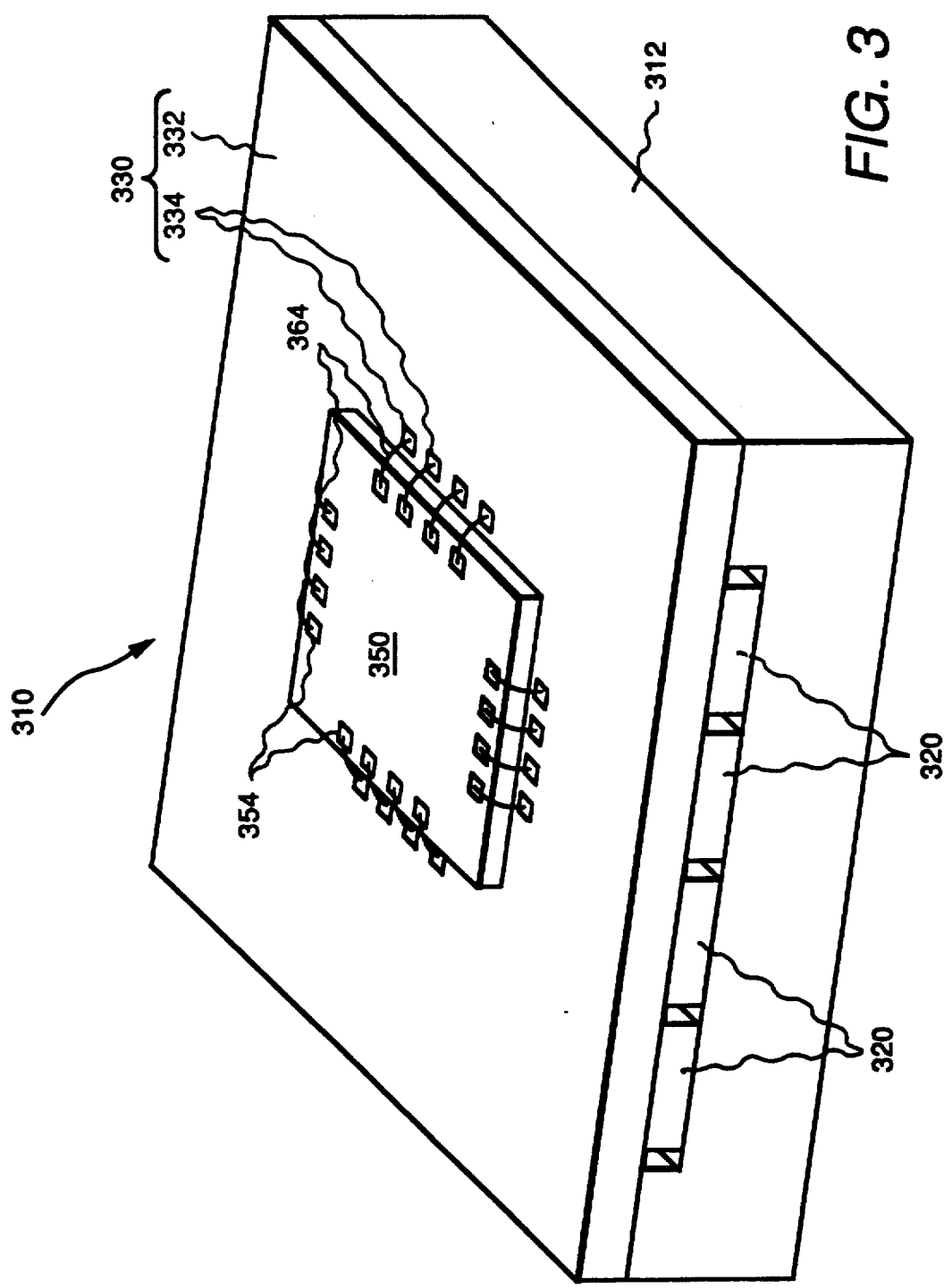

An alternative structure 310 for a high density interconnect structure in accordance with the present invention is illustrated in a perspective view in FIG. 3. The structure 310 is similar to the structure 210 with the exception that no capacitors are illustrated in the structure and the control chip 350 has its back surface bonded to the upper surface of the high density interconnect structure 330. Contact pads 354 disposed on the upper surface of the control chip 350 are connected to contact pads 334 on the upper surface of the high density interconnect structure 330 by wire bonds 364 which are also known as flying leads. Fabrication of the high density interconnect structure is completed prior to bonding chip 350 to the high density interconnect structure. The wire bonds are then attached. Consequently, the chip 350 is not exposed to the processing temperatures used during fabrication of the high density interconnect structure. Further, the chip 350 has never had the high density interconnect structure dielectric layer disposed thereover. As a consequence, chips 350, which would be adversely affected by exposure to the high density interconnect structure processing temperatures or which would be adversely affected by the presence of the high density interconnect structure dielectric on the upper surface thereof, may be connected to this high density interconnect structure in a straightforward manner. Chips of this type include EPROMS which need their central portion unobstructed by ultraviolet light absorbing layers, imaging structures which are sensitive to portions of the electromagnetic spectrum which are attenuated by the high density interconnect structure dielectric and temperature sensitive chips in general, including infrared focal plane arrays.

Further, independent of any considerations of temperature exposure or dielectric overlay, the chip 350 can be centrally positioned over the chips which are interconnected by the high density interconnect structure with the result that substantially symmetric, short connecting leads may be used to connect the chip 350 to the various chips of the high density interconnect structure. This is particularly advantageous where the chips 320 within the high density interconnect structure include spare or redundant chips which must be selectively connected to external contacts of the high density interconnect structure by a control chip. The chip 350 is ideally positioned to serve as such a control chip and is readily accessible for erasure and reprogramming where that chip is an EPROM which is erased by ultraviolet light.

Figure 4:
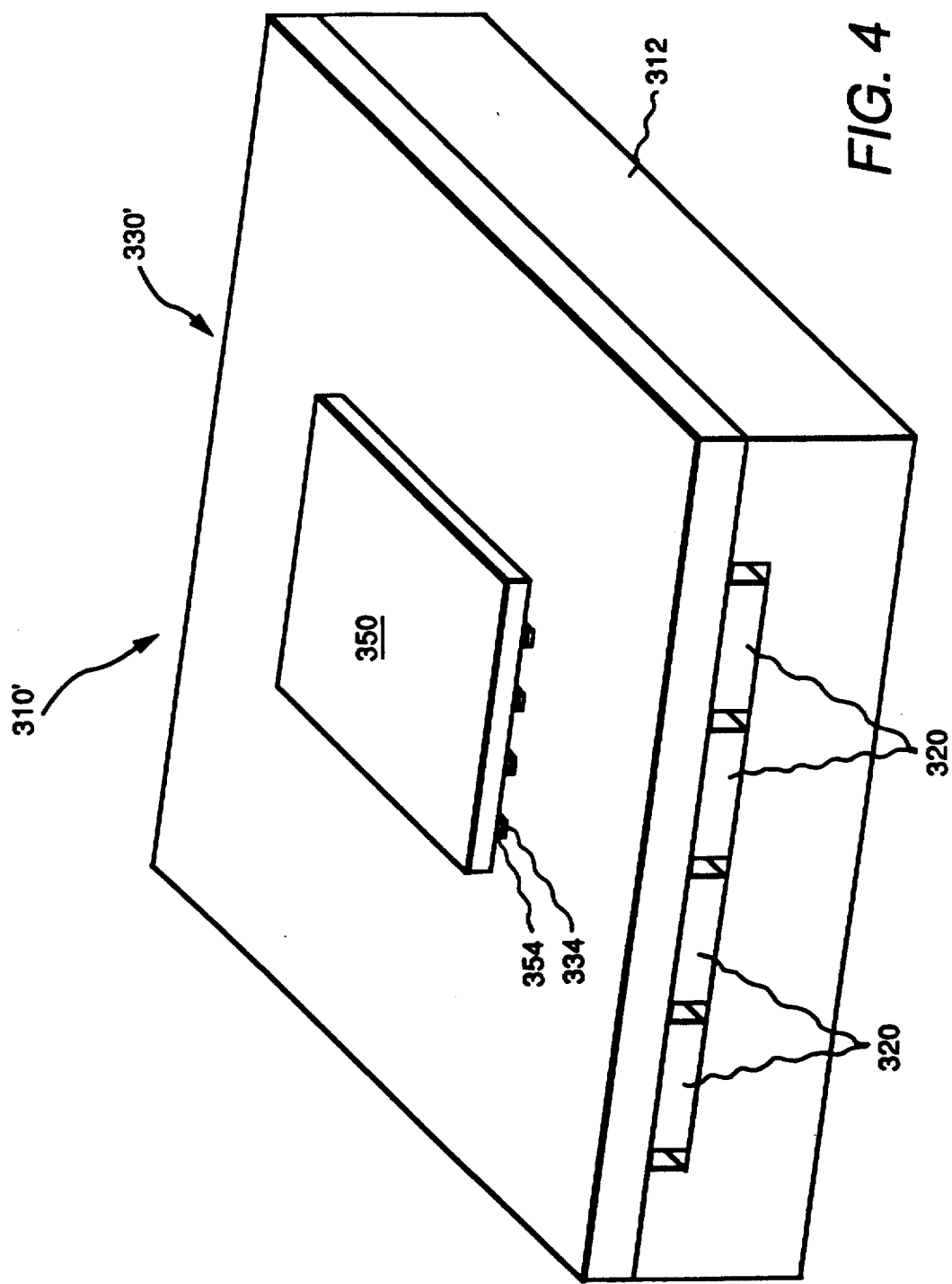

In FIG. 4, an alternative configuration 310' for the high density interconnect structure of FIG. 3 is illustrated in perspective view. The structure 310' is similar to the structure 310 with the exception that the control chip 350 is mounted on the high density interconnect structure in a flip chip manner by solder reflow. This avoids the complexities of wire bonding between contact pads disposed at different altitudes and avoids the problems of flying leads which present their own reliability problems since they are easily bent and can short or break if subjected to anything by the most careful handling.

Further, this mounting configuration is ideal for imaging chips of the type which include an imaging area which is thinned from the back side of the chip and intended to have the images-to-be-sensed projected on the chip's back surface. This flip-chip mounting places that back surface of the chip upward for image projection and directly connects the chip's front-surface contact pads to the contact pads of the high density interconnect structure which preferably contains the chips for controlling and reading out the sensed images. This structure minimizes lead lengths in such a multichip system. A chip of this type cannot be mounted in a high density interconnect structure in the prior art manner unless special provisions are made such as an underlying aperture in the substrate or by providing a contact structure in the chip cavity for flip chip mounting.

Such a chip could be included in a flexible portion of a high density interconnect structure in a location where there is no substrate under the chip in the final structure in accordance with related application Ser. No. 07/504,769.

Figure 5:
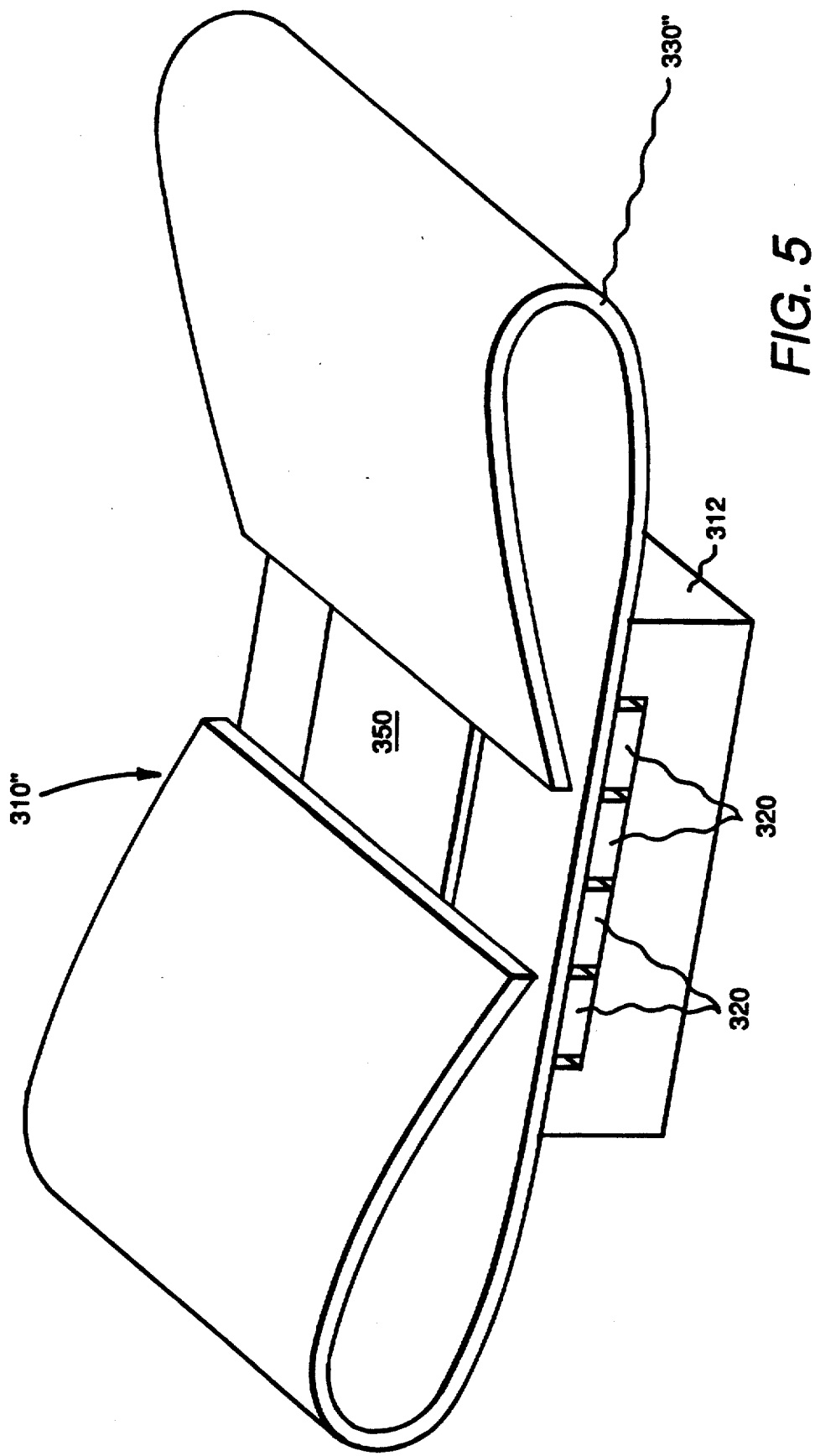

In FIG. 5, a further alternative structure 310" is illustrated in perspective view. The structure 310" is similar to the structure 310 with the exception that instead of providing the contact pads 334 on the upper surface of the high density interconnect structure in a pattern which is suitable for wire bonding to the contact pads of the chip 350, the contact pads are provided on a flexible portion of the high density interconnect structure in appropriate positions for bonding to the contact pads of the chip 350. This flexible portion of the high density interconnect structure is then folded over, as shown in FIG. 5, to bring the high density interconnect structure contact pads into alignment with the contact pads of the chip 350. These contact pads may be bonded by solder reflow or by laser welding through use of a laser projected through the substantially transparent dielectric of the high density interconnect structure to heat the metal of the contact pads to cause the welding or to reflow solder. Other bonding techniques may also be used. Alternatively, a flexible tape cable may be used rather than a flexible portion of the high density interconnect structure.

A variety of other techniques may be employed for connecting a top mounted chip to a high density interconnect structure. All such techniques achieve the advantage of not placing the control or other chip on top of the high density interconnect structure until after completion of the high density interconnect process and offer the advantage of allowing the top mounted chip to be centrally positioned with respect to the chips which are embedded in the high density interconnect structure.

Figure 6:
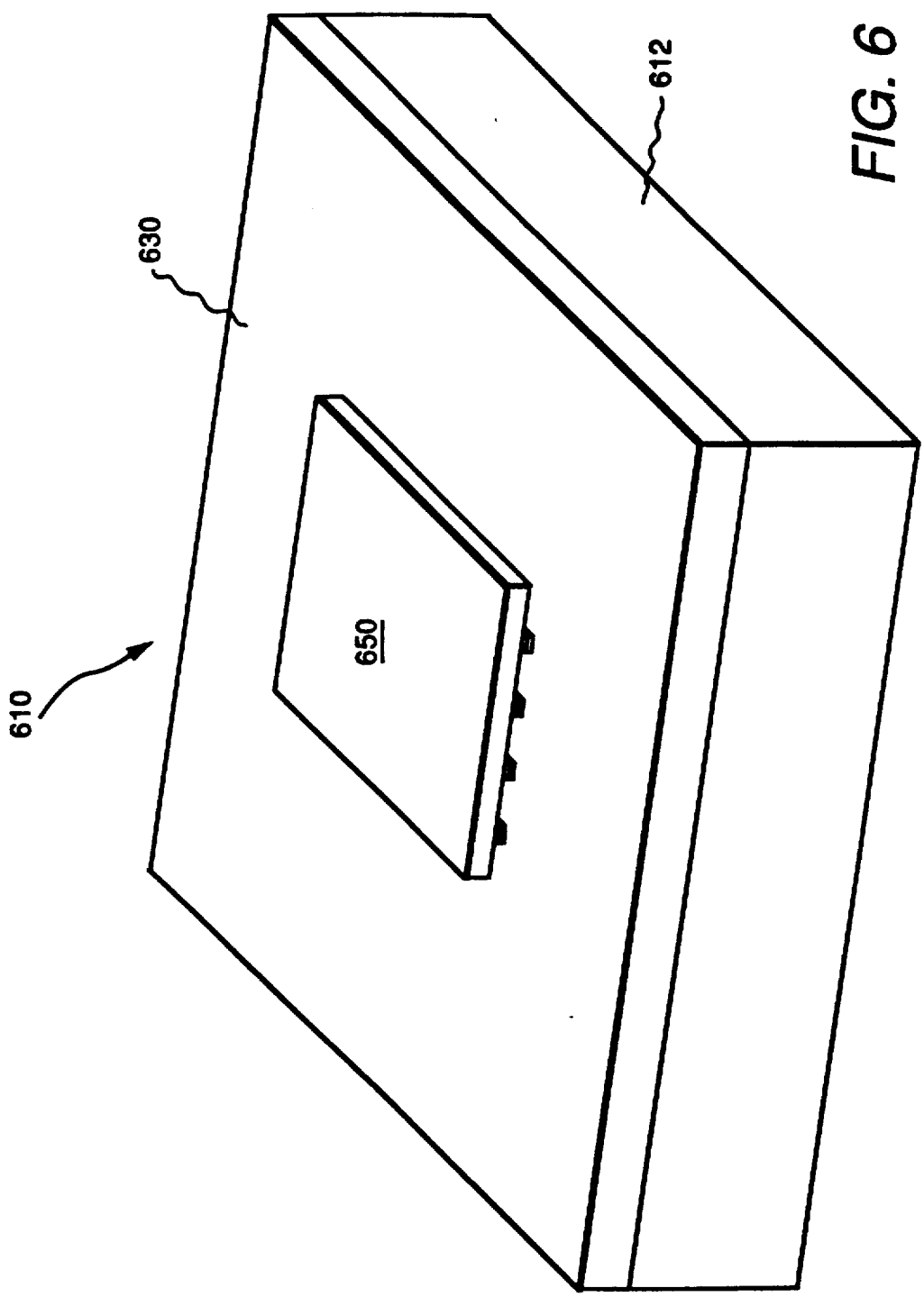

As illustrated in FIG. 6, this top mounted chip technique can be used with a single large semiconductor chip 612 with a small chip 650 mounted on top thereof to control the function of the large chip. Such control functions may include the selection of appropriate subsystems within the large chip for interconnection through external contacts or the top mounted chip can serve a decoding or other function as may be appropriate to the content and function of the large chip 612. The top mounted control chip 650 may be flip-chip bonded to the high density interconnect structure 630, as illustrated in FIG. 6, or may be connected by flying leads or other techniques as may be considered desirable. While a variety of uses for high density interconnect structure having top mounted components have been illustrated and described, it will be recognized that this technique can be used for the mounting of essentially any component as may be considered desirable in a particular system or application.

Figure 7:
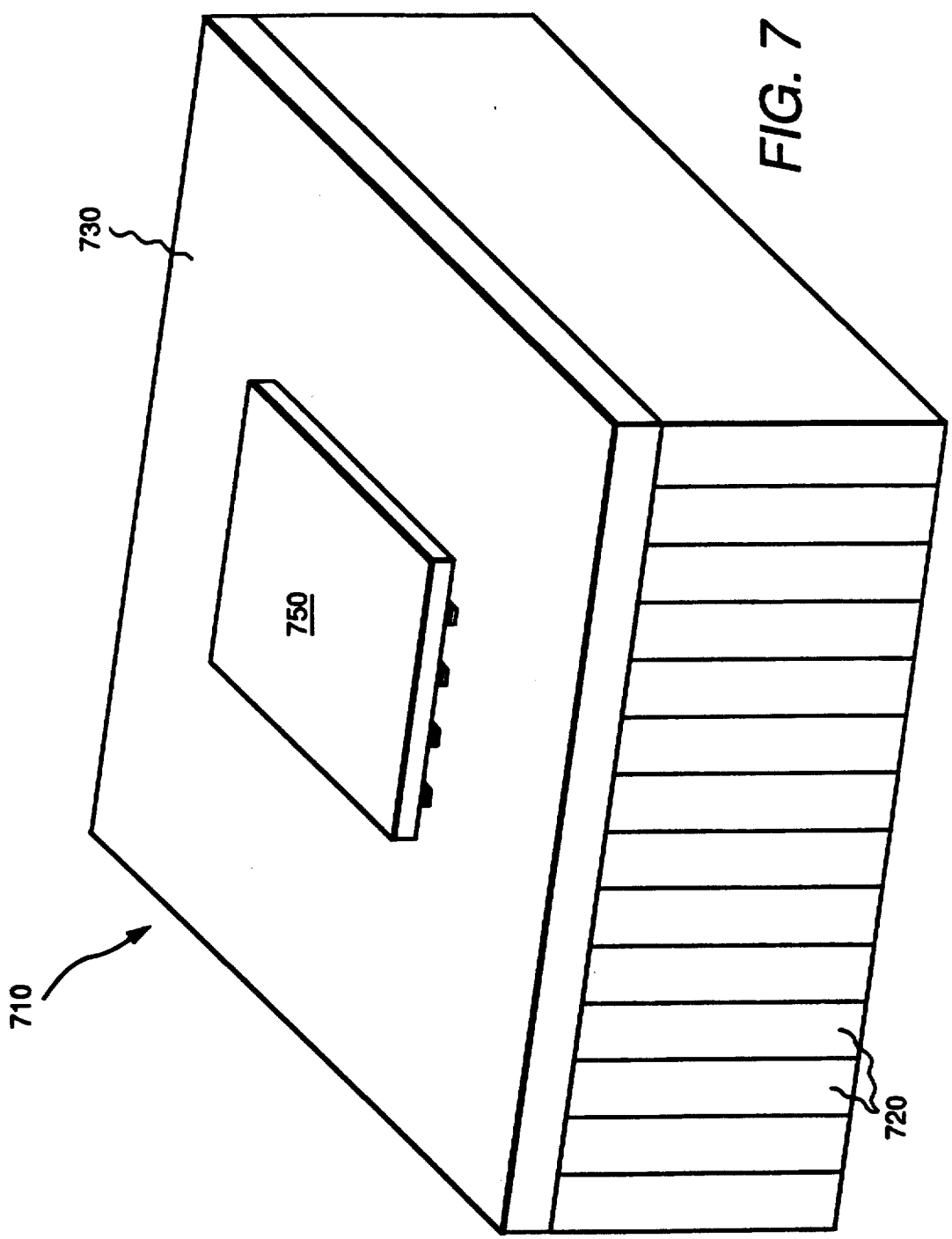

The use of this top mounted technique is not limited to single high density interconnect structures as shown in FIGS. 2-5 or a single chip as shown in FIG. 6, but may also be applied to a 3-D structure comprising a plurality of flat high density interconnect structures which have been stacked one upon another to form a unitary structure and on which a second high density interconnect structure has been fabricated along a surface of that unitary structure at which the various layers of the unitary structure are exposed. That second high density interconnect structure interconnects the various first high density interconnect structures to form a complex overall system. One or more control or other chips may be mounted on top of that second high density interconnect structure to aid in testing or control or for any other appropriate purpose. Such a structure is shown schematically in FIG. 7 at 710. The structure 710 comprises a plurality of individual high density interconnect structures 720 which have been stacked together and stood on edge. The high density interconnect structure 730 has then been formed on the planar surface formed by the edges of the first high density interconnect structures 720. The control chip 750 is shown connected to the high density interconnect structure 730 by flip chip bonding. Other bonding techniques may also be employed.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic system comprising:
    a substrate having a component-supporting surface with at least one cavity therein;
    a first plurality of electric components having contact pads on major surfaces thereof, said first plurality of electronic components being disposed in said at least one cavity such that said major surfaces are substantially coplanar with portions of said component-supporting surface surrounding said at least one cavity;
    a removable high density interconnect structure, said high density interconnect structure being removable from said electronic components without damaging said electronic components and without removing said components from said at least one cavity, and comprising:
    a layer of polymer dielectric film overlying and bonded by means of a thermoplastic adhesive to said major surfaces of said first plurality of electronic components and to portions of said component-supporting surface surrounding said at least one cavity,
    said layer of polymer dielectric film having via holes therein in alignment with said contact pads, and
    a pattern of interconnection conductors disposed on said layer of polymer dielectric film so as to extend into and between at least some of said via holes to provide electrical connection between at least some of said contact pads; and
    at least one additional electronic component disposed on said high density interconnect structure on the opposite side of said high density interconnect structure from said first plurality of electronic components, and electrically connected to conductors of said high density interconnect structure.

2. The electronic system recited in claim 1 wherein: said additional electronic component is bonded to said high density interconnect structure.

3. The electronic system recited in claim 1 wherein: said additional electronic component comprises a passive component.

4. The electronic system recited in claim 3 wherein: said additional electronic component comprises a discrete capacitor.

5. The electronic system recited in claim 1 wherein: said additional electronic component comprises an active device.

6. The electronic system recited in claim 1 wherein: said additional electronic component comprises an integrated circuit.

7. The electronic system recited in claim 1 wherein: said additional electronic component comprises an image sensor.

8. The electronic system recited in claim 1 wherein: said high density interconnect structure includes exposed contact pads.

9. The electronic system recited in claim 1 wherein: said additional electronic component comprises a chip having a plurality of contact pads disposed thereon.

10. The electronic system recited in claim 9 wherein: said chip is mounted with its contact pads facing away from said first plurality of electronic components.

11. The electronic system recited in claim 10 comprising:
    bridging conductors connecting said contact pads of said chip to said high density interconnect structure.

12. The electronic system recited in claim 11 wherein: said bridge conductors comprise wire bonds.

13. The electronic system recited in claim 11 wherein: said bridging conductors comprise flying leads.

14. The electronic system recited in claim 10 wherein: said high density interconnect structure comprises a flexible portion connected to said contact pads of said chip.

15. The electronic system recited in claim 14 wherein: said flexible portion of said high density interconnect structure is bonded to said contact pads of said chip.

16. The electronic system recited in claim 10 comprising:
    a flexible tape cable connected between said contact pads of said chip and said high density interconnect structure.

17. The electronic system recited in claim 9 wherein: said chip is mounted with its contact pads facing toward said first plurality of electronic components.

18. The electronic system recited in claim 17 wherein: said contact pads of said chip are solder bonded to conductors of said high density interconnect structure.

19. The electronic system recited in claim 17 wherein: said contact pads of said chip are welded to conductors of said high density interconnect structure.

20. The electronic system recited in claim 1 wherein: said first plurality of first electronic components includes spare components;

said additional electronic component comprises means for rendering selected ones of said first plurality of components active in said system.

21. The electronic system recited in claim 1 wherein:
said additional electronic component exhibits electrical operating characteristics which would be changed if said layer of dielectric material were disposed on the surface thereof.

22. The electronic system recited in claim 21 wherein:
said additional electronic component comprises a radiation sensor.

23. The electronic system recited in claim 22 wherein:
said radiation sensor is an image sensor.

24. The electronic system recited in claim 21 wherein:
said additional electronic component comprises a microwave component.

25. The electronic system recited in claim 1 wherein:
said additional electronic component comprises an electronically programmable read only memory; and
said additional electronic component is connected to selectively control the connection of said first plurality of electronic components to external contacts of said high density interconnect structure.

26. The electronic system recited in claim 1 wherein:
said additional electronic component comprises a thermoelectric cooler.

27. The electronic system recited in claim 1 wherein:
said additional electronic component is subject to thermally induced deterioration at temperatures used in the fabrication of said high density interconnect structure.

28. The electronic system recited in claim 1 including:
a plurality of said additional electronic components, each of said plurality of said additional electronic components being disposed on said high density interconnect structure.

29. An electronic system comprising:
a multilayer stack of high density interconnect structures, each of said high density interconnect structures comprising:
a first plurality of first electronic components;
a layer of dielectric material bonded to said first plurality of electronic components, and
a pattern of high density interconnect conductors disposed on said layer of dielectric material, said high density interconnect conductors interconnecting said first plurality of electronic components;
a second high density interconnect structure disposed on a side surface of said multilayer stack and interconnecting the high density interconnect structure layers of said stack; and
ad additional electronic component disposed on said second high density interconnect structure and electrically connected to said second high density interconnect structure.

30. An electronic system comprising:
a substrate having a component-supporting surface with a cavity therein;
a first electronic component having contact pads on a first surface thereof, said first electronic component being disposed in said cavity such that said first surface is substantially coplanar with portions of said component-supporting surface surrounding said at least one cavity;
a removable high density interconnect structure, said high density interconnect structure being removable from said electronic component without damaging said electronic component and without removing said electronic component from said cavity, and comprising:
a layer of polymer dielectric film overlying and bonded by means of a thermoplastic adhesive to said first surface of said first electronic component and to portions of said component-supporting surface surrounding said at least one cavity,
said layer of polymer dielectric film having via holes therein in alignment with said contact pads, and
a pattern of interconnection conductors disposed on said layer of polymer dielectric film, said conductors connecting said contact pads of said first electronic component to surface contact pads disposed on an exposed surface of said high density interconnect structure; and
a second electronic component disposed on said high density interconnect structure on the opposite side of said high density interconnect structure from said first electronic component, and electrically connected to said surface contact pads of said high density interconnect structure.

31. The electronic system recited in claim 30 wherein:
said first electronic component includes spare, redundant subsystems; and
said second electronic component comprises means for rendering selected ones of said subsystems active in said system.

32. The electronic system recited in claim 30 wherein:
said first electronic component includes a plurality of subsystems therein; and
said second electronic component performs a decoding function for selecting among subsystems of said first electronic component.

33. The electronic system recited in claim 30 wherein:
said second component exhibits electrical operating characteristics which would be changed if said layer of dielectric material were disposed on the surface thereof.

34. The electronic system recited in claim 30 wherein:
said second component comprises an electronically programmable read only memory; and
said second component is connected to selectively control the connection of subsystems within said first electronic component to external contacts.

35. The electronic system recited in claim 30 wherein:
said first electronic component comprises a semiconductor chip.

36. In an electronic system of the type including a substrate having a component-supporting surface with at least one cavity therein; a first plurality of electronic components having contact pads on major surfaces thereof, said first plurality of electronic components being disposed in said at least one cavity such that said major surfaces are substantially coplanar with portions of said component-supporting surface surrounding said at least one cavity; a high density interconnect structure removable from said first plurality of electronic component without damaging first plurality electronic components and without removing said first plurality of electronic components from said at least one cavity, and including a layer of polymer dielectric film overlying and bonded by means of a thermoplastic adhesive to said major surfaces of said first plurality of electronic components and to portions of said component-supporting surface surrounding said at least one cavity, said layer of polymer dielectric film having via holes therein in alignment with said contact pads, and a pattern of interconnect conductors disposed on said layer of polymer dielectric film so as to extend into at least some of said via holes to electrically interconnect said first plurality of electronic components, the improvement comprising:

an additional electronic component mounted on said high density interconnect structure on the opposite side of said high density interconnect structure from said first plurality of electronic components and electronically connected to said pattern of conductors; and said additional component being operable to connect selected ones of said first plurality of electronic components to external contacts of said system.

* * * * *

UNITED STATES PATENT AND TRADEMARK OFFICE
CERTIFICATE OF CORRECTION

PATENT NO. : 5,200,810
DATED : April 6, 1993
INVENTOR(S) : R. Wojnarowski et al

It is certified that error appears in the above-indentified patent and that said Letters Patent is hereby corrected as shown below:

The drawing sheet, consisting of Fig. 1A and Fig. 1B should be added on the attached page.

Signed and Sealed this

Thirteenth Day of September, 1994

Attest:

BRUCE LEHMAN

Attesting Officer      Commissioner of Patents and Trademarks